United States Patent [19]
Sahara et al.

[11] Patent Number: 5,237,532
[45] Date of Patent: Aug. 17, 1993

[54] SERIALLY-ACCESSED TYPE MEMORY DEVICE FOR PROVIDING AN INTERLEAVED DATA READ OPERATION

[75] Inventors: Hiroshi Sahara, Tokyo; Haruki Toda, Yokohama; Shigeo Ohshima, Tokyo, all of Japan

[73] Assignee: Kabushiki Kaisha Toshiba, Kawasaki, Japan

[21] Appl. No.: 794,668

[22] Filed: Nov. 18, 1991

Related U.S. Application Data

[63] Continuation of Ser. No. 66,260, Jun. 25, 1987, abandoned.

[30] Foreign Application Priority Data

Jun. 30, 1986 [JP] Japan .................. 61-151582

[51] Int. Cl.5 .................. G11C 7/00; G11C 8/00
[52] U.S. Cl. .................. 365/189.05; 365/230.04; 365/239; 365/221
[58] Field of Search .................. 365/189.02, 230.02, 365/230.03, 230.04, 239, 207, 205, 221, 189.05

[56] References Cited

U.S. PATENT DOCUMENTS

| | | | |
|---|---|---|---|
| 3,691,534 | 9/1972 | Varadi et al. | 365/182 X |
| 4,072,932 | 2/1978 | Kitagawa et al. | 365/207 X |
| 4,330,852 | 5/1982 | *Redwine et al. | 365/205 X |
| 4,393,472 | 7/1983 | Shimada et al. | 365/230.04 X |
| 4,475,181 | 10/1984 | Etoh et al. | 365/230.04 X |
| 4,587,637 | 5/1986 | Ishizuka | 365/230 X |
| 4,596,001 | 6/1986 | Baba | 365/221 X |
| 4,646,272 | 2/1987 | Takasugi | 365/233 |
| 4,656,614 | 4/1987 | Suzuki | 365/189 X |
| 4,672,587 | 6/1987 | Geiger et al. | 365/230 |
| 4,680,738 | 7/1987 | Tam | 365/230.04 X |
| 4,685,088 | 8/1987 | Iannucci | 365/194 X |
| 4,754,433 | 6/1988 | Chin et al. | 365/203 X |
| 4,849,937 | 7/1989 | Yoshimoto | 365/230.04 X |

OTHER PUBLICATIONS

IBM Technical Disclosure Bulletin, vol. 26, No. 11, Apr. 1984, Data Selection Scheme for Bipolar Arrays, Chan et al.

Ishimoto et al., "A 256K Dual Port Memory," IEEE International Solid-State Circuits Conference, (ISSCC 85), Digest of Technical Papers, WAM 3.1, pp. 38-39, Feb. 1985.

Primary Examiner—Andrew L. Sniezek
Attorney, Agent, or Firm—Finnegan, Henderson, Farabow, Garrett & Dunner

[57] ABSTRACT

In a semiconductor memory having a column-direction serial access function, two systems of circuits for selecting and fetching data are provided. A circuit operation is alternately performed such that one system is set up while the other system is accessed, thereby reducing a cycle time for a data selecting/fetching operation.

8 Claims, 9 Drawing Sheets

SERIALLY-ACCESSED TYPE MEMORY DEVICE FOR PROVIDING AN INTERLEAVED DATA READ OPERATION

This application is a continuation of application Ser. No. 07/066,260, filed Jun. 25, 1987 now abandoned.

BACKGROUND OF THE INVENTION

The present invention relates to a memory device and, more particularly, to a memory device used in a memory having a serial access function in the column direction (i.e., the next access address is determined).

In a conventional random access memory, a series of operations are performed in one cycle which is determined in accordance with control signals or address signals of an external input. These operations include accepting and decoding an externally input address in a column direction, activation of a column selection line to transfer data to a data bus line, and activation of an output driver to output the data.

On the other hand, in a memory having a serial access function, an address to be accessed next is determined, unlike in the random access memory. For this reason, the above series of operations need not be performed in one cycle determined by the externally input signals, but can be set up (prepared) beforehand.

However, in the arrangement where only one data transmission system is provided, the above series of operations must be performed by a single data transfer system, regardless of an operation state from which an access in a present cycle is started. For this reason, although an access itself can be performed at a high speed, it is difficult to reduce a cycle time.

SUMMARY OF THE INVENTION

The present invention has been made in consideration of the above situation, and has as its object to provide a memory device having a column-direction serial access function, which is capable of reducing a cycle time that cannot be realized by conventional technique.

According to the present invention, in a memory having a column-direction serial access function, two or more circuit systems for selecting/fetching data are provided in a single device, and one system is set up while the other is in an access operation, to thereby reduce a cycle time.

DETAILED DESCRIPTION OF THE PREFERRED EMBODIMENT

Figure 1:
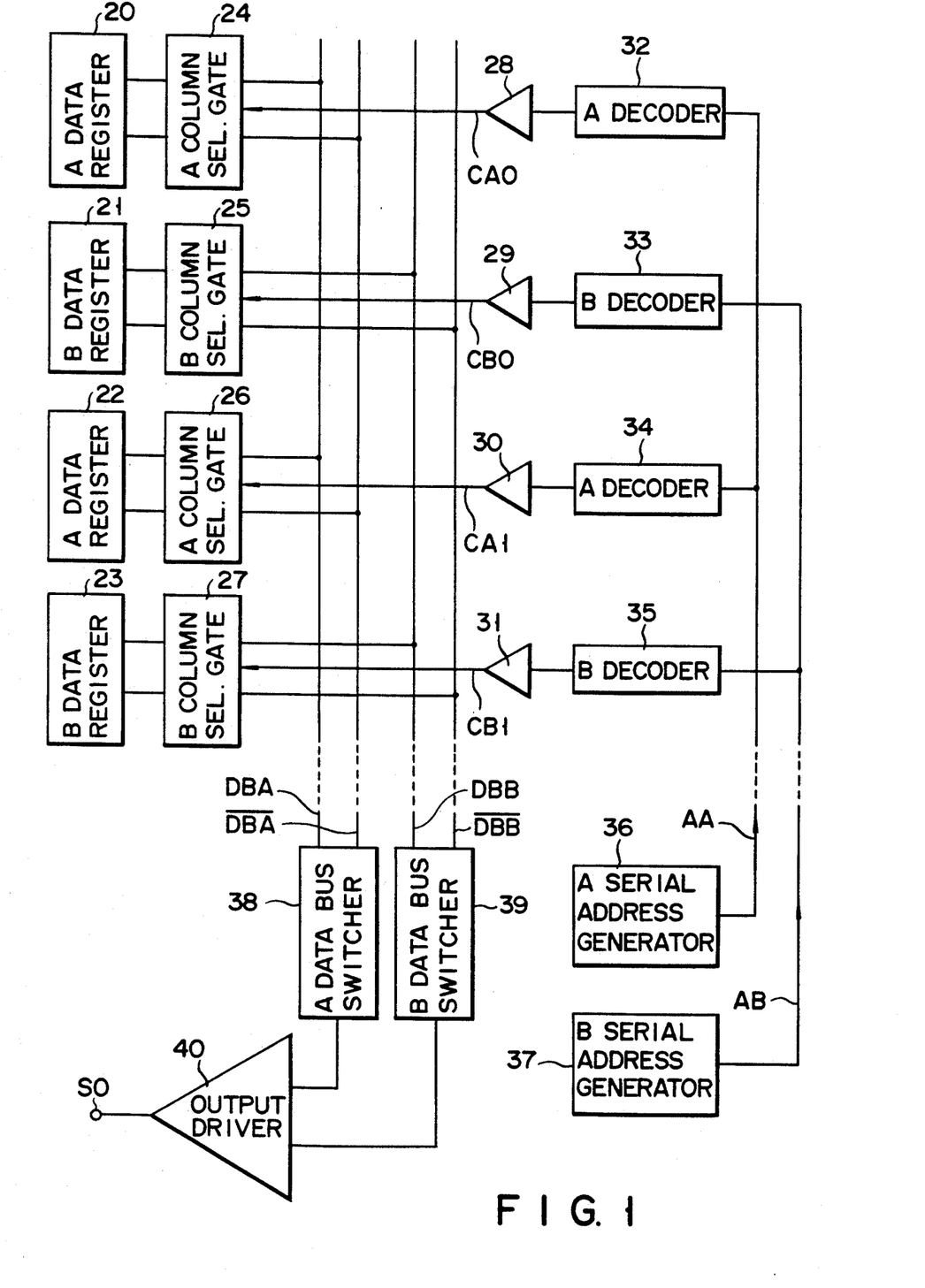
FIG. 1 is a block diagram of an essential part of a read section used when the present invention is applied to a serially-accessed type semiconductor memory.

An embodiment of the present invention will now be described with reference to the accompanying drawings. FIG. 1 is a block diagram of an internal circuit arrangement of a column-direction serially-accessed memory according to the embodiment of the present invention, and FIGS. 2A to 2D are flow charts for explaining an operation thereof. According to this embodiment, in a semiconductor memory having a column-direction serial access function, two systems A and B for selecting/fetching data are provided in a single chip. Reference numerals 20 and 22 denote A data registers (or A bit lines); 21 and 23, B data registers (or B bit lines); 24 and 26, A column selecting gates; 25 and 27, B column selecting gates; 28 and 30, A column selecting line drivers; 29 and 31, B column selecting line drivers; 32 and 34, A decoders; 33 and 35, B decoders; 36, an A serial address generator; 37, a B serial address generator; 38, an A data bus switcher; 39, a B data bus switcher; 40, an output driver; CA0 and CA1, A column selecting lines; CB0 and CB1, B column selecting lines; DBA and $\overline{DBA}$, A data bus lines; DBB and $\overline{DBB}$, B data bus lines; AA, an A address bus line; AB, a B address bus line; and SO, a data output. All of these circuit elements can be formed in a one-chip IC pellet.

A data read operation of the memory shown in FIG. 1 will be described. Assume that registers (or bit lines) 20, 21, 22, and 23 are accessed in this order. Note that a description will be made with reference to a case wherein the present cycle is a cycle for accessing data of register 22 which belongs to system A.

Figure 2A:
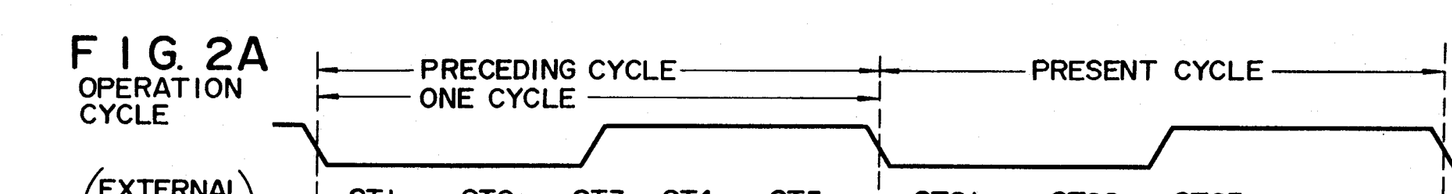
FIGS. 2A to 2D are flow charts for explaining a data read operation of the memory shown in FIG. 1.
Figure 2B:
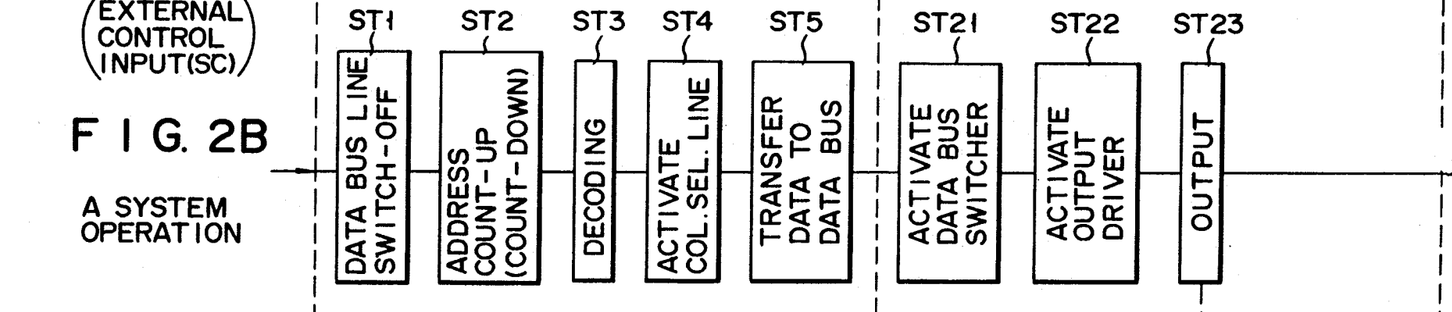
Figure 2C:
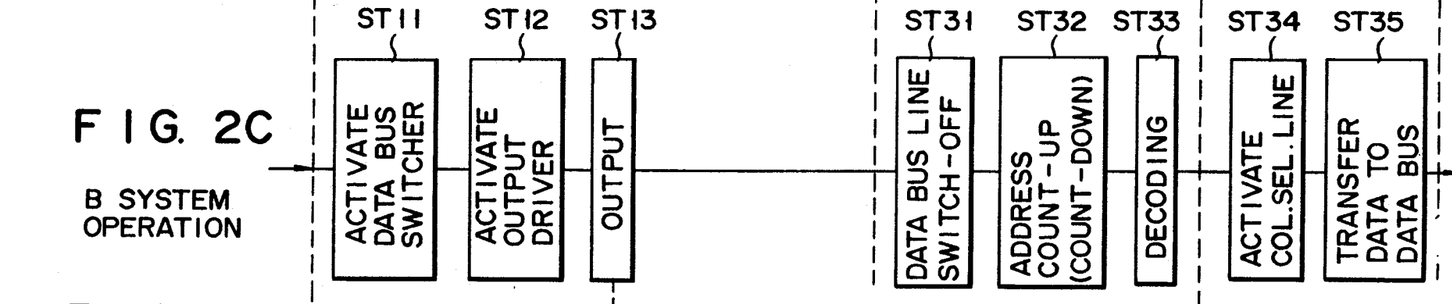
Figure 2D:
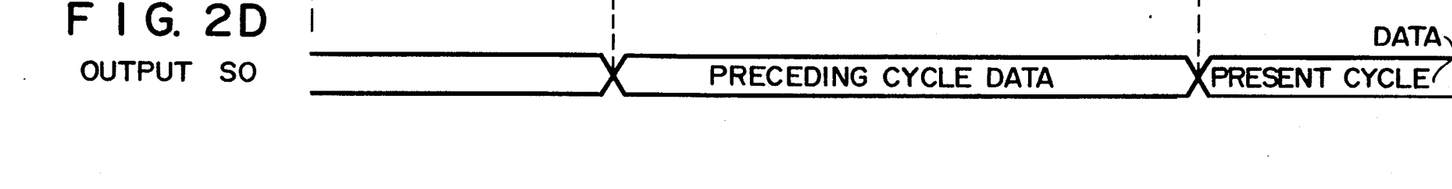

In this case, since the preceding cycle is a cycle for accessing from system B, switcher 38 is turned off, as shown in step ST1 of FIG. 2B, and switcher 39 is activated and hence is in an ON state, as shown in step ST11 of FIG. 2C. As shown in steps ST12 and ST13, data of register 21 are transferred to driver 40 through bus lines DBB and $\overline{DBB}$.

On the other hand, when system A is disconnected from driver 40 by OFF switcher 38, an address of the present cycle is set in generator 36 (step ST2), and decoder 34 corresponding to the set address is selected (step ST3). Then, selecting line CA1 is activated (step ST4), and data of register 22 are transferred to bus lines DBA and $\overline{DBA}$, as shown in step ST5.

When a present cycle, subsequent to the above cycle, begins (FIG. 2A), switcher 39 is turned off as shown in step ST31 of FIG. 2C, and switcher 38 is activated and hence is in an ON state as shown in step ST21 of FIG. 2B. Then, bus lines DBA and $\overline{DBA}$ are connected to driver 40 through ON switcher 38 (step ST22). The data of register 22 is transferred to driver 40 as shown in step ST23, and data SO transferred from driver 40 is output.

When system B is disconnected from driver 40, generator 37 is activated, and the address is counted up (or down) as shown in step ST32. Decoder 35 is selected in correspondence to the counted-up (or -down) address (step ST33), and selecting line CB1 is activated (step ST34). Then, the data of register 23 are transferred to bus lines DBB and $\overline{DBB}$ as shown in step ST35, thereby completing set-up for access in the next cycle.

Figure 3:
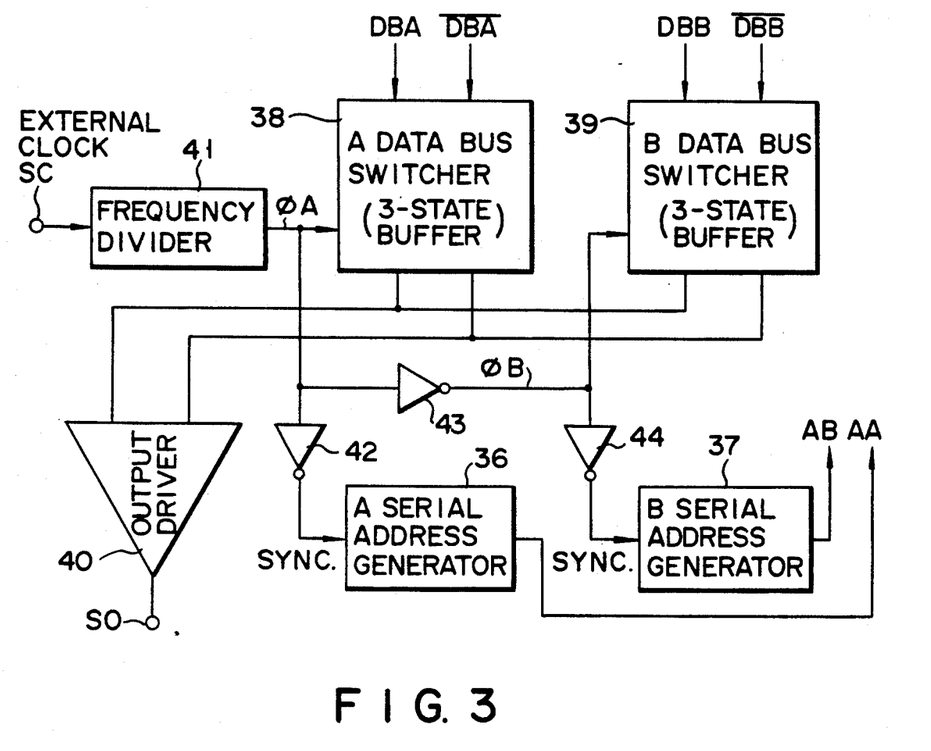
FIG. 3 is a block diagram of hardware for alternately operating two data transfer systems (A and B) in the arrangement shown in FIG. 1.
Figure 4A:
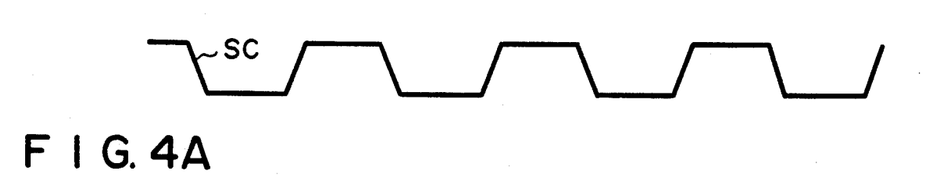
FIGS. 4A to 4C are views of waveforms for explaining an operation of the hardware shown in FIG. 3.
Figure 4B:
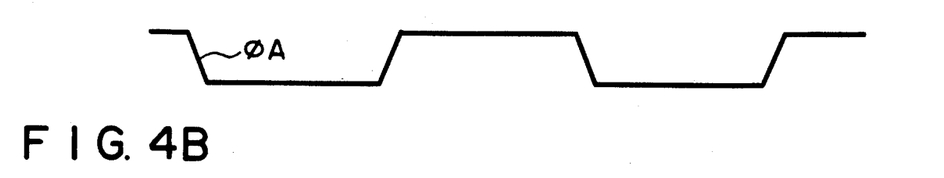
Figure 4C:
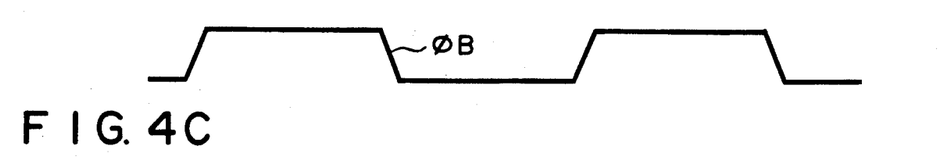

FIG. 3 shows hardware for alternately operating systems A and B in the arrangement shown in FIG. 1. FIGS. 4A to 4C show waveforms for explaining an operation of the hardware shown in FIG. 3.

External clock SC (FIG. 4A) having a period of one cycle shown in FIG. 2A is converted through ½ frequency divider 41 into pulse $\phi A$ (FIG. 4B) for selecting system A. Pulse $\phi A$ is supplied to a 3-state buffer which constitutes switcher 38. When pulse $\phi A$ is logic "1", buffer 38 connects bus lines DBA and $\overline{DBA}$ to driver 40. When pulse $\phi A$ is logic "0", buffer 38 is opened, and bus lines DBA and $\overline{DBA}$ are disconnected from driver 40.

Pulse $\phi A$ is phase-inverted, via inverter 42, to be a synchronous signal having the same waveform as that of pulse $\phi B$ of FIG. 4C, and is supplied to a clock input terminal of an address counter in generator 36. A content (address data) of output AA of generator 36 is updated (counted up or down) by 1 at the fall timing of pulse $\phi A$.

In addition, pulse $\phi A$ is phase-inverted, by inverter 43, to be pulse $\phi B$ of FIG. 4C. Pulse $\phi B$ is further phase-inverted, by inverter 44, to be a synchronous signal having the same waveform as that of pulse $\phi A$ of FIG. 4B, and is supplied to a clock input terminal of an address counter in generator 37. A content (address data) of output AB of generator 37 is updated (counted up or down) by 1 at the fall timing of pulse $\phi B$.

On the other hand, In order to select system B, pulse $\phi B$ is supplied to a 3-state buffer which constitutes switcher 39. When pulse $\phi B$ is logic "1", buffer 39 connects bus lines DBB and $\overline{DBB}$ to driver 40. (At this time, since pulse $\phi A$ is logic "0", driver 40 is disconnected from bus lines DBA and $\overline{DBA}$.)

As described above, switchers 38 and 39 are alternately opened/closed every one period (one cycle of FIG. 2A) of clock SC so as to alternately select systems A and B. Then, in synchronism with each alternate selection, the contents of data AA and AB are updated by 1 for every two periods (two cycle of FIG. 2A) of clock SC.

Figure 5:
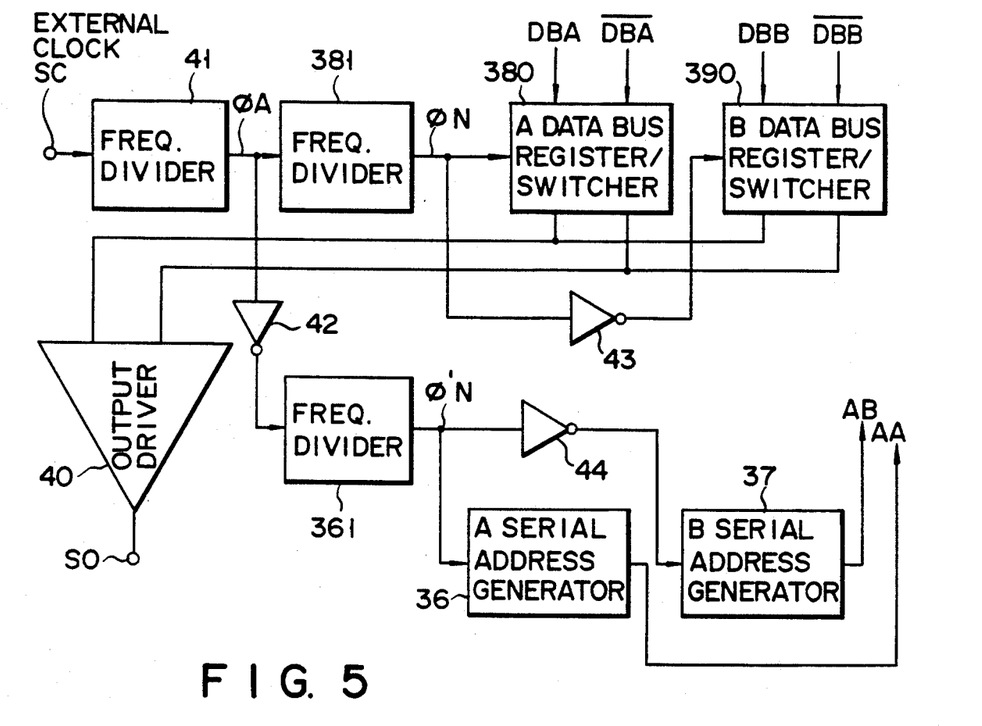
FIG. 5 is a block diagram of a modification of the hardware shown in FIG. 3, in which data bus switchers (38 and 39) are replaced with registers (380 and 390)
Figure 6A:
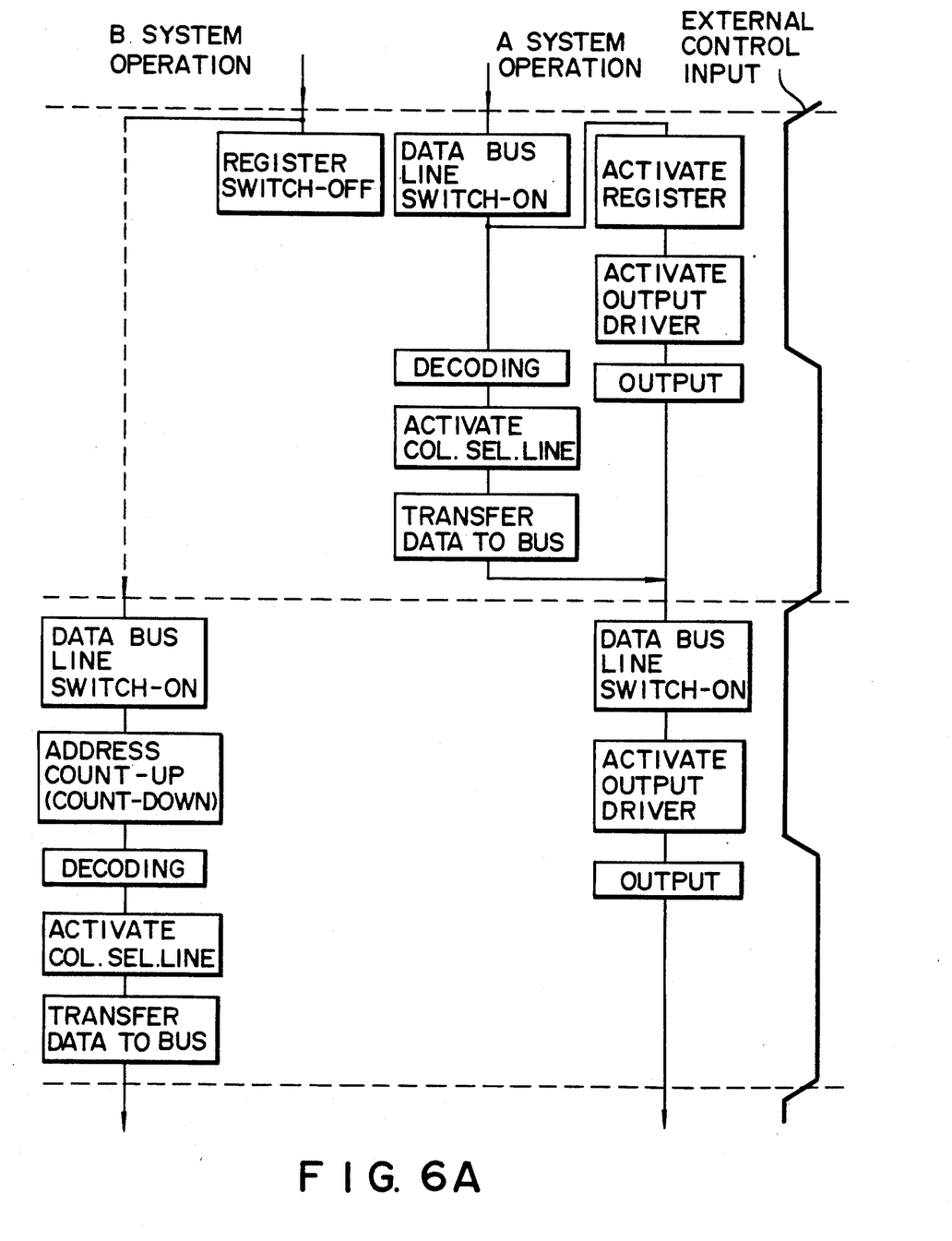
FIGS. 6A and 6B are flow charts for explaining an operation of the memory shown in FIG. 1 using the hardware shown in FIG. 5.
Figure 6B:
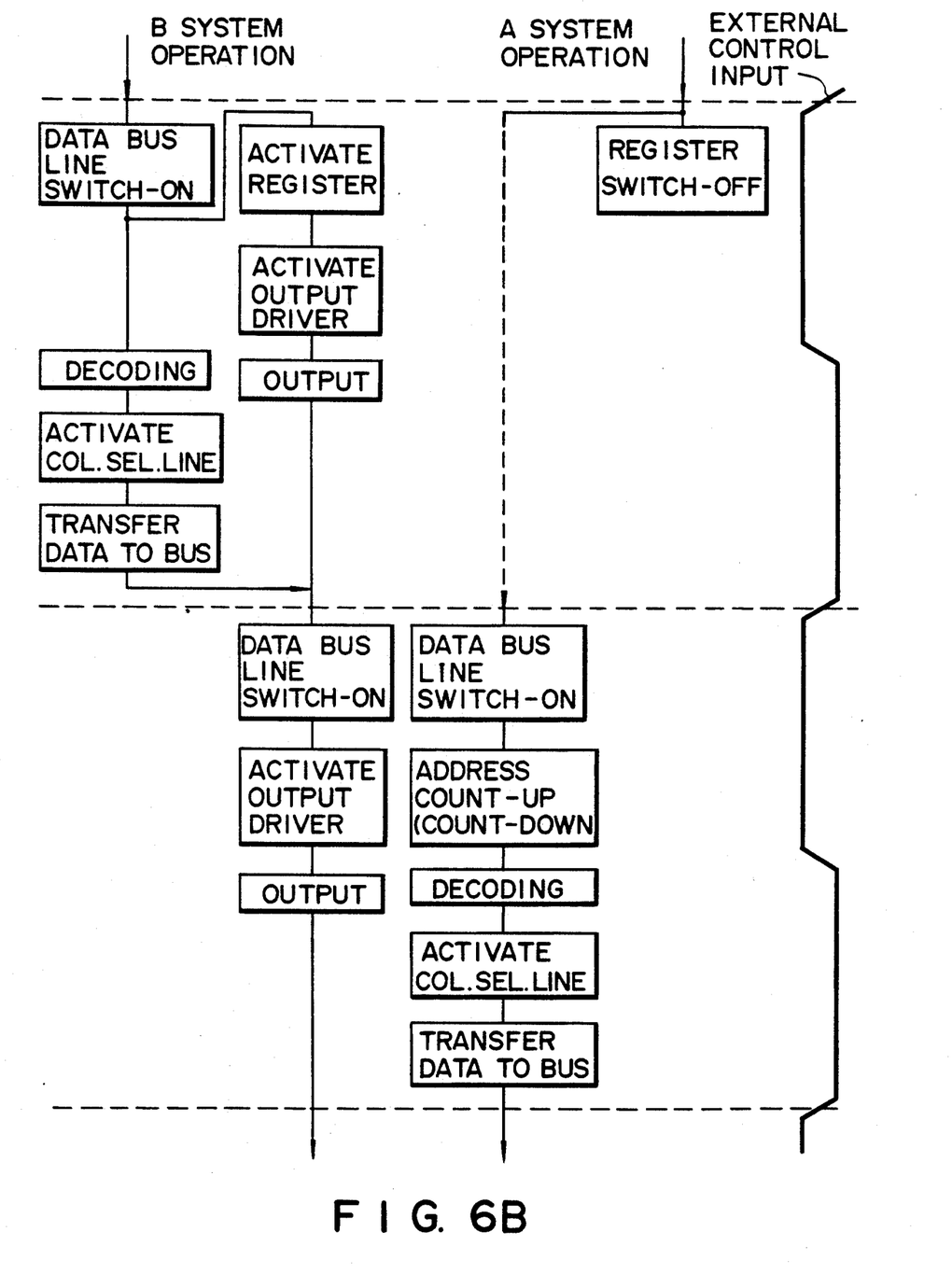

FIG. 5 shows hardware wherein switchers 38 and 39 shown in FIG. 3 are replaced with registers/switches 380 and 390, respectively. When the hardware shown in FIG. 3 is used, systems A and B are alternately switched in the order of A→B→A→B→. . . However, when the hardware shown in FIG. 5 is used, the same data can be alternately switched twice as in the order of A→A B→B→A→A→B→B→. . . This two-time alternate switching operation is exemplified in FIGS. 6A and 6B.

When the above two-time alternate switching operation is to be performed, ½ frequency divider 381 is inserted between frequency divider 41 and each of registers/switchers 380 and 390, in order that the connections for registers/switchers 380 and 390 are alternatively switched for each two cycles. More specifically, frequency-divided output $\phi N$ from divider 381 is applied to register/switcher 380, and the phase-inverted signal of output $\phi N$, obtained via inverter 43, is applied to register/switcher 390. In this circuit configuration, output signal $\phi N$ from divider 381 has a period two times longer than the period of clock $\phi A$.

In the A system, the data transmission from bus lines DBA, $\overline{DBA}$ to register 380 is carried out at the timing of the falling edge of external control clock input SC, provided $\phi N$=logic "1". After completion of the data transmission, register 380 is disconnected from bus lines DBA, $\overline{DBA}$. Meanwhile, during the period of $\phi N$=logic "1", register 380 is connected to output driver 40.

In the B system, the data transmission from bus lines DBB, $\overline{DBB}$ to register 390 is carried out at the timing of the falling edge of external control clock input SC, provided $\phi N$=logic "0". After completion of the data transmission, register 390 is disconnected from bus lines DBB, $\overline{DBB}$. Meanwhile, during the period of $\phi N$=logic "0", register 390 is connected to output driver 40.

In the embodiment of FIG. 5, the contents of address AA (or AB) are required to be fixed during the two-time transmission of the same data DBA (or DBB). To satisfy this requirement, ½ frequency divider 361 is inserted between frequency divider 41 and each of address generators 36 and 37. More specifically, frequency-divided output $\phi A$ from divider 41 is applied to frequency divider 361 via inverter 42. Frequency-divided output $\phi N'$ from divider 361 is applied to address generator 36, and is applied, via inverter 44, to address generator 37. Note here that output $\phi N'$ from divider 361 is to be activated one cycle in advance of the activation of output $\phi N$ from divider 381.

According to the embodiment of FIG. 5, when 1/N (N is a natural number) frequency dividers are used both for dividers 361 and 381, an N-time alternate switching operation can be performed.

When the same data is transferred a plurality of times as shown in FIG. 5, reliability of a content of the transferred data can be improved. However, since an operation speed of the memory is reduced, the hardware shown in FIG. 5 may be adopted as necessary.

Figure 7:
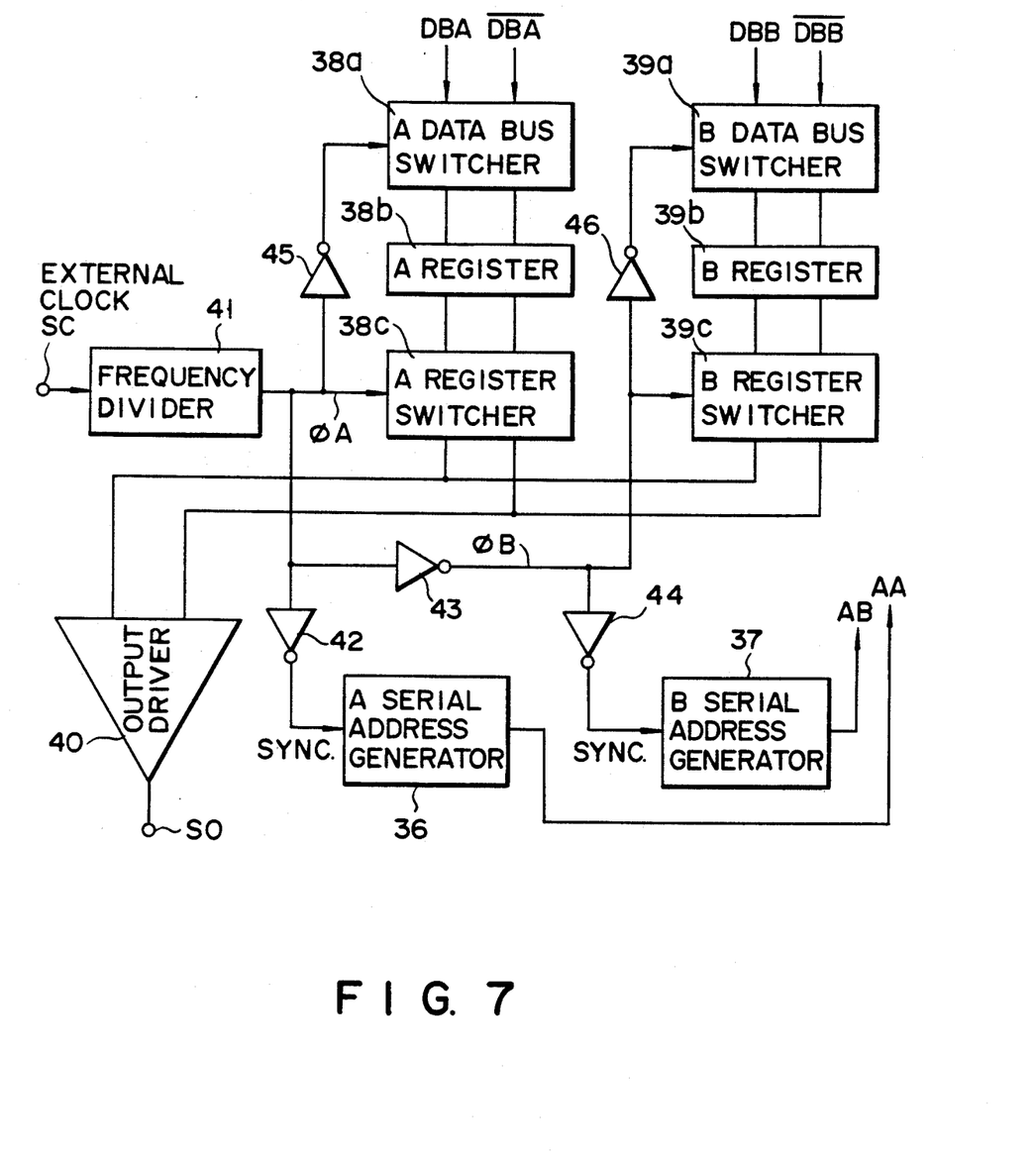
FIG. 7 is a block diagram of a modification of the hardware shown in FIG. 3, showing hardware capable of reducing a cycle time of the memory shown in FIG. 1 shorter than that obtained by the hardware shown in FIG. 3.

FIG. 7 shows a modification of switchers 38 and 39 shown in FIG. 3. According to the modification shown in FIG. 7, switcher 38a (3-state buffer) is conducted by an output of logic "1" from inverter 45 while switcher 38c (3-state buffer) is opened by logic "0" of pulse $\phi A$, thereby storing the data of bus lines DBA and $\overline{DBA}$ in register 38b.

While the data of system A is stored, switcher 38c conducted by logic "1" of pulse $\phi B$, and a content of register 39b is supplied to buffer 40. At this time, since an output from inverter 46 is logic "0", switcher 39a is opened.

When $\phi A$=logic "1" and $\phi B$=logic "0" in the next cycle, a content of register 38b is supplied to driver 40, and at the same time, the data of bus lines DBB and $\overline{DBB}$ are stored in register 39b.

Figure 8:
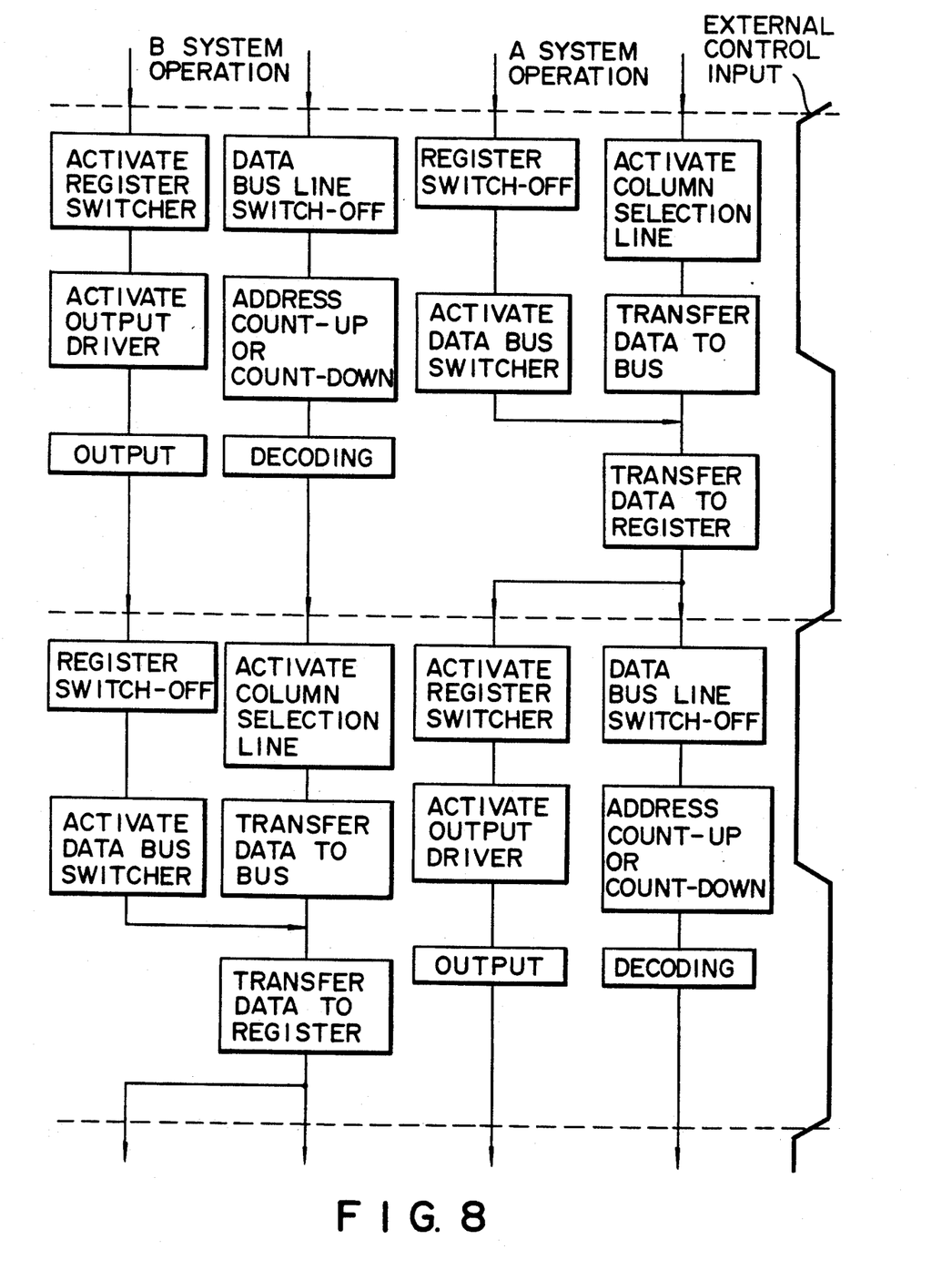
FIG. 8 is a flow chart for explaining an operation of the memory shown in FIG. 1 using the hardware shown in FIG. 7.

FIG. 8 shows an operation of the modification shown in FIG. 7. As will be seen from a comparison of the flow chart shown in FIG. 8 with those shown in FIGS. 2B and 2C, a time required for one cycle is reduced by the arrangement shown in FIG. 7. That is, five steps ST1 to ST5 in one cycle of FIG. 2B are reduced to three serial steps in FIG. 8 when viewed along the serial flow of time. Similarly, five serial steps ST31 to ST35 in FIG. 2C are reduced to three serial steps in FIG. 8. Thus, the number of processing steps, included time-serially in one cycle, is reduced, so that a cycle time can be reduced more effectively.

Figure 9:
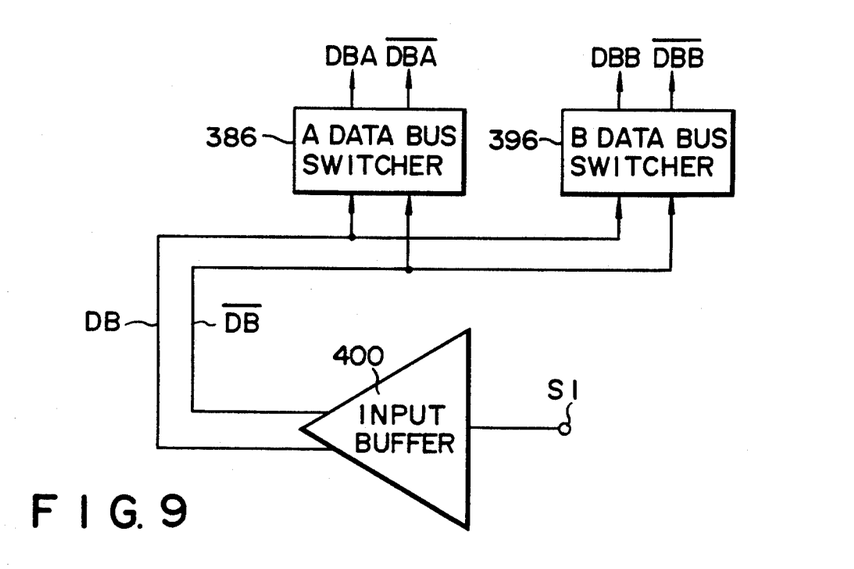
FIG. 9 is a block diagram partially showing a changed portion used when the arrangement shown in FIG. 1 is applied for data writing.
Figure 10A:
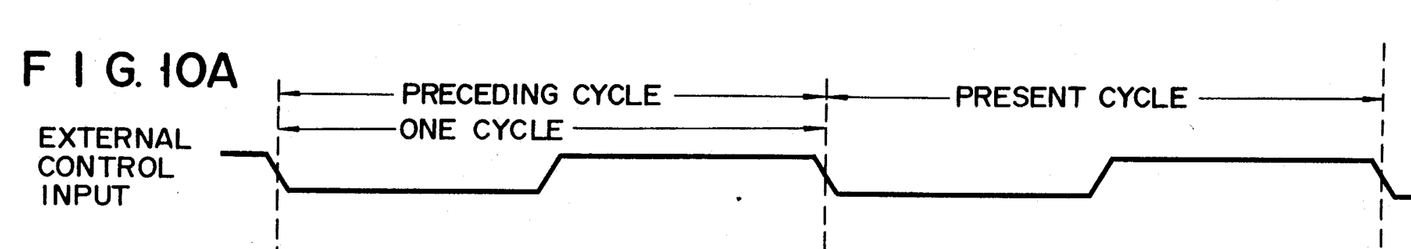
FIGS. 10A to 10D are flow charts for explaining a data write operation used when the arrangement shown in FIG. 9 is applied to the memory shown in FIG. 1.
Figure 10B:
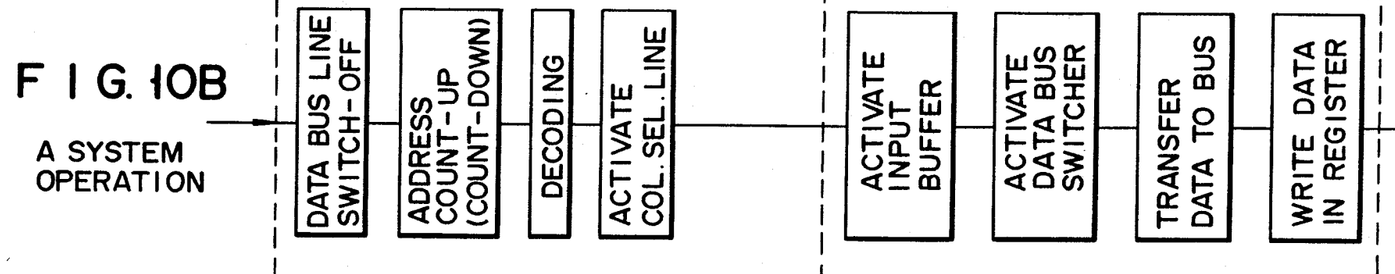
Figure 10C:
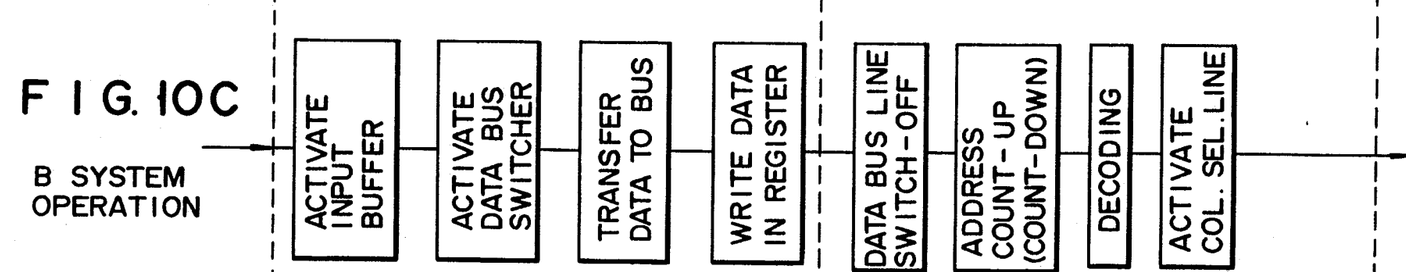
Figure 10D:
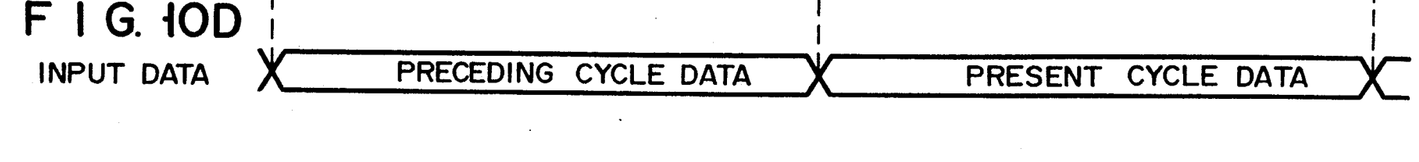

FIG. 9 shows a modified portion when the arrangement (for reading out data) shown in FIG. 1 is modified to that for writing data. Writing input data SI is converted into data DB in phase with data SI and data $\overline{DB}$ opposite phase to data SI through input buffer 400. Data DB and $\overline{DB}$ are supplied to bus lines DBA and $\overline{DBA}$ through data bus switcher 386, and are supplied to bus lines DBB and $\overline{DBB}$ through switcher 396. The other portions of the arrangement of FIG. 9 can be the same as those of the arrangement shown in FIG. 1. FIGS. 10A and 10B show a data write operation of the arrangement, obtained by applying the modified portion shown in FIG. 9 to the arrangement shown in FIG. 1.

According to the embodiments as shown in FIG. 1 etc., systems A and B are operated with a time shift of about ½ cycle. For this reason, one cycle time of these embodiments only requires a time substantially half that of a conventional one cycle including steps ST1 to ST5 and ST21 to ST23. Therefore, a cycle time can be reduced. That is, according to the present invention, both the systems (A, B) are alternately operated so that data is set up in one system (e.g., A) while data is output in the other (e.g., B), thereby reducing the cycle time. In addition, when the present invention is applied in a single semiconductor memory chip and two systems (A and B) of data selecting/fetching circuits are provided therein, a high speed memory operation can be achieved by the single chip.

Note that the present invention can be applied to all the memories except a random access type (i.e., wherein an address to be accessed next to the present address is determined). Therefore, the present invention can also be applied to reduction in a read cycle time of a serially-accessed type semiconductor ROM or of a CDROM having two-channel optical pickup systems, etc.

What is claimed is:

1. A semiconductor memory having a column-direction serial access function with odd and even read operation cycles, comprising:
    frequency divider means for providing a plurality of clock signals to distinguish between odd and even read operation cycles;
    first serial address generator means for generating first address data;
    second serial address generator means for generating second address data;
    first decoder means for decoding the first address data to provide a first plurality of selection signals;
    second decoder means for decoding the second address data to provide a second plurality of selection signals;
    first bus means for transferring read data that is output during odd operation cycles;
    second bus means for transferring read data that is output during even operation cycles;
    a first plurality of registers for storing read data that is output during odd read operation cycles;
    a second plurality of registers for storing read data that is output during even read operation cycles;
    output means for outputting read data;
    first column selection gate means, coupled to the first bus means and to the first plurality of registers, for selectively coupling one of said first plurality of registers to said first bus means in accordance with the first plurality of selection signals and only at times when read data is output from the first plurality of registers;
    second column selection gate means, coupled to the second bus means and to the second plurality of registers, for selectively coupling one of said second plurality of registers to said second bus means in accordance with the second plurality of selection signals and only at times when read data is output from the second plurality of registers;
    odd switcher means, coupled to the first bus means and to the frequency divider means, for coupling said first bus means to said output means during odd read operation cycles; and
    even switcher means, coupled to the second bus means and to the frequency divider means, for coupling said second bus means to said output means during even read operation cycles.

2. A semiconductor memory in accordance with claim 1, in which:
    the first decoder means includes means for providing a first and a second selection signal;
    the second decoder means includes means for providing a third and a fourth selection signal;
    the first plurality of registers includes a first and a second register;
    the second plurality of registers includes a third and a fourth register;
    the first column selection gate means includes means for coupling the first register to the first bus means in accordance with the first selection signal, and includes means for coupling the second register to the first bus means in accordance with the second selection signal;
    the second column selection gate means includes means for coupling the third register to the second bus means in accordance with the third selection signal, and includes means for coupling the fourth register to the second bus means in accordance with the fourth selection signal.

3. A semiconductor memory in accordance with claim 2, in which the semiconductor memory comprises a single integrated circuit.

4. A semiconductor memory in accordance with claim 2, in which:
    the first bus means and odd switcher means include first latch means, for temporarily storing read data from the first bus means and transferring the stored read data to the output means during odd read operation cycles; and
    the second bus means and even switcher means include second latch means, for temporarily storing read data from the second bus means and transferring the stored read data to the output means during even read operation cycles.

5. A semiconductor memory in accordance with claim 2, in which:
    the odd switcher means includes means for coupling said first bus means to said output means for a time period corresponding to a plurality of odd read operation cycles; and
    the even switcher means includes means for coupling said second bus means to said output means for a time period corresponding to a plurality of even read operation cycles.

6. A semiconductor memory in accordance with claim 1, in which the semiconductor memory comprises a single integrated circuit.

7. A semiconductor memory in accordance with claim 1, in which:

the first bus means and odd switcher means include first latch means, for temporarily storing read data from the first bus means and transferring the stored read data to the output means during odd read operation cycles; and the second bus means and even switcher means include second latch means, for temporarily storing read data from the second bus means and transferring the stored read data to the output means during even read operation cycles.

8. A semiconductor memory in accordance with claim 1, in which:

the odd switcher means includes means for coupling said first bus means to said output means for a timer period corresponding to a plurality of odd read operation cycles; and the even switcher means includes means for coupling said second bus means to said output means for a time period corresponding to a plurality of even read operation cycles.

* * * * *